United States Patent
Effenberger

(10) Patent No.: US 6,465,054 B2
(45) Date of Patent: Oct. 15, 2002

(54) PROCESS FOR COATING SURFACES

(75) Inventor: Franz Effenberger, Stuttgart (DE)

(73) Assignee: Roche Diagnostics GmbH, Mannheim (DE)

( * ) Notice: Subject to any disclaimer, the term of this patent is extended or adjusted under 35 U.S.C. 154(b) by 0 days.

(21) Appl. No.: 09/175,457

(22) Filed: Oct. 20, 1998

(65) Prior Publication Data

US 2002/0015778 A1 Feb. 7, 2002

(30) Foreign Application Priority Data

Oct. 21, 1997 (DE) .......................... 197 46 388
Jun. 23, 1998 (DE) .......................... 198 27 900

(51) Int. Cl.[7] .............................. B05D 3/06; B05D 5/00
(52) U.S. Cl. ...................................... 427/553; 427/2.13
(58) Field of Search ................................ 427/508, 510, 427/515, 551, 553, 554, 2.13, 581, 582, 583

(56) References Cited

U.S. PATENT DOCUMENTS

| 3,953,309 A | * | 4/1976 | Gilano et al. ............... 427/510 |
|---|---|---|---|
| 3,969,543 A | * | 7/1976 | Roberts et al. ............. 427/510 |
| 4,363,634 A | * | 12/1982 | Schall, Jr. .................. 427/2.13 |
| 4,390,343 A | * | 6/1983 | Walter ....................... 427/2.13 |
| 4,672,024 A | * | 6/1987 | Glaever et al. ............. 427/2.13 |
| 4,791,069 A | * | 12/1988 | Hovorka et al. ........... 427/2.13 |
| 5,077,085 A | * | 12/1991 | Schaur et al. ............... 427/510 |
| 5,240,747 A | * | 8/1993 | Matsuda et al. ........... 427/2.13 |
| 5,316,784 A | * | 5/1994 | Maurer et al. ............. 427/2.13 |
| 5,510,628 A | | 4/1996 | Georger, Jr. et al. |
| 5,635,246 A | | 6/1997 | Ogawa et al. |
| 5,643,580 A | * | 7/1997 | Subramaniam ........... 427/2.13 |
| 5,846,814 A | * | 12/1998 | Galla et al. ................ 427/2.13 |
| 5,849,480 A | * | 12/1998 | Cros et al. ................. 427/5.13 |
| 5,919,712 A | * | 7/1999 | Herron et al. ............. 427/2.13 |

FOREIGN PATENT DOCUMENTS

| EP | 0 506 993 A1 | 10/1992 |
|---|---|---|
| WO | WO 92/10092 | 11/1991 |

* cited by examiner

Primary Examiner—Marianne Padgett
(74) Attorney, Agent, or Firm—Arent Fox Kintner Plotkin & Kahn, PLLC

(57) ABSTRACT

The invention concerns a process for coating a metallic or semimetallic surface in which coating molecules containing reactive groups are bound covalently to the surface by irradiation with light and it also concerns a structured coated surface.

22 Claims, 3 Drawing Sheets

1a: n = 15; R = CH₃ b: n = 15; R = c: n = 16; R =

2

3a: n = 16
b: n = 12

Figure 3
SAM formation of tetradecanal on Si(111)-H surfaces
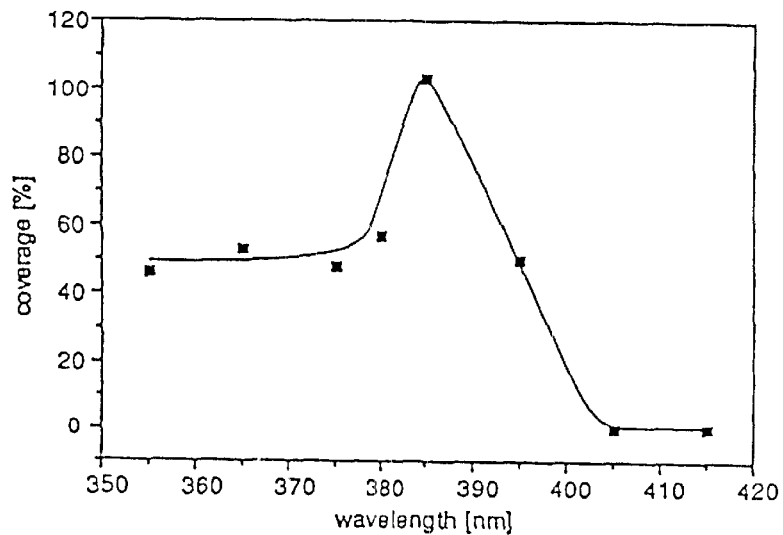
SAM formation of octadecene on Si(111)-H surfaces
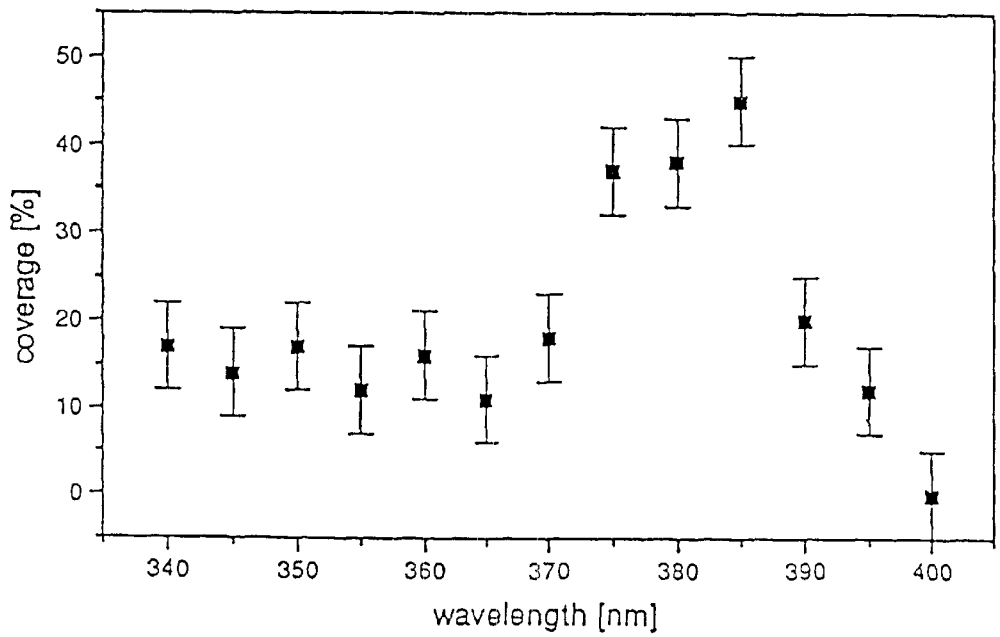
Figure 4

PROCESS FOR COATING SURFACES

DESCRIPTION

The invention concerns a new process for coating a metallic or semimetallic surface as well as a structured coated surface.

Surfaces can be functionalized by coating in order to achieve predetermined and desirable properties. The covalent coating of silicon surfaces with organic molecules via a carbon-silicon bond is known (M. R. Linford et al.; J. Am. Chem. Soc. 115 (1993), 12631–12632;M. R. Linford et al., J. Am. Chem. Soc. 117 (1995), 3145–3155). These coatings were produced by reacting hydrogen-terminated Si (111) with 1-alkenes by means of a radical mechanism using diacyl peroxides as radical starters. However, the use of peroxides is disadvantageous since peroxides are extremely reactive, dangerous to health and furthermore their reactivity has a low specificity.

Furthermore it is known that self-assembled monolayers of functionalized organosilyl compounds can be formed on hydroxylated silicon surfaces (F. Effenberger et al., Synthesis 1995, 1126–1130; K. Bierbaum et al., Langmuir 11 (1995), 512–518; S. Heid et al., Langmuir 12 (1996), 2118–2120; P. Harder et al., Langmuir 13 (1997), 445–454). The covalent binding of silicic acid compounds to the OH groups of an oxidized silicon surface is described in EP-A-0 664 452. However, a disadvantage of this process is that the surface has to be chemically pretreated before coating and moreover undesired cross-linking reactions can occur. In addition it is advantageous for many applications when the coating is applied to a metallic and not to an oxidized surface.

The object of the present invention was therefore to provide a process for coating metallic surfaces which does not have the disadvantages that occur in the prior art.

The object is achieved according to the invention by a process for coating a metallic or semimetallic surface which is characterized in that coating molecules which contain reactive groups are bound covalently to the surface by irradiation with light.

It was surprisingly found that activation with light enabled an efficient coating of metallic or semimetallic surfaces with molecules containing reactive groups to be obtained. In connection with the present invention the term "reactive group" means that the reactive group is covalently bound to a surface under suitable conditions and when irradiated with light of a suitable wavelength.

The binding of the coating molecules to the surface can be based on a direct photoactivation of reactive groups in the coating molecules. Furthermore the binding can also be achieved by photoactivation of the surface itself if this contains reactive groups e.g. groups that can be activated by light e.g. metal or/and semimetal hydride compounds such as silicon hydride. The groups on the surface activated by light are then able to covalently bind to reactive groups of the coating molecules. A combination of both reaction mechanisms i.e. photoactivation of the coating molecules and photoactivation of the surface is also possible.

The surfaces to be coated have metallic or semimetallic properties and can comprise one or several metals, semimetals or/and metallic or semimetallic compounds. Examples of suitable elements which form a metallic or semimetallic surface are metals and semimetals of groups 3 to 16 of the periodic system. Particularly preferred examples are silicon, germanium and metallic compounds that contain these elements. Examples of surfaces which contain more than one element are alloys which comprise two or several metals or/and semimetals. An example of a compound which has metallic properties is gallium arsenide. The surface is particularly preferably a hydrogenated surface i.e. the metal or/and semimetal atoms of the surface layer are at least partially bound to hydrogen. An example of a metal or semimetal hydride is silicon hydride. The metallic surfaces used according to the invention are in particular surfaces which have non-oxidized elements or compounds.

According to the invention the molecules containing the reactive groups are bound covalently to the metallic or semimetallic surface, for example via a surface element-carbon or surface element-oxygen bond. In this connection the molecules used can basically contain any reactive group i.e. a group which can be converted directly or/and due to interactions with the surface, into a reactive species and in particular into a radical by irradiation with light. The reactive group is preferably selected from C=C or C=O double bonds. Examples of such reactive groups are alkene, aldehyde and vinyl ether groups. Aldehyde groups are particularly preferred which can be used to obtain surprisingly high degrees of coverage. In the case of aldehyde groups binding to the surface is via the oxygen. In contrast to known coating processes on hydroxylated silicon surfaces in which the thickness of the $SiO_2$ layer is undetermined, it is possible to obtain predetermined, defined and uniform coatings with the process according to the invention.

When using alkene groups, the coating molecules are bound to the surface via a carbon atom.

Coated metallic or semimetallic surfaces are produced by the process according to the invention which are suitable for numerous applications e.g. to manufacture microelectronic components as well as for applications in diagnostics and medicine. Applications for functionalized surfaces which have been produced by chemically coupling coating molecules to the surface are described for example in WO 92/10092, Fodor et al., (Nature 364 (1993), 555–556) and Cheng and Stevens (Adv. Mater. 9 (1997), 481–483). Surfaces coated according to the invention by photoactivation are also suitable for these applications.

For this purpose it is expedient to use molecules for the coating which contain at least one additional functional group in addition to one or several reactive groups. The additional functional group is preferably selected from haptens, biotin, chelating groups, nucleotides, nucleic acids, nucleic acid analogues, polyethylene glycol, conjugated π-systems, charged groups, non-linear optical structures, cross-linkable groups, electrically conductive groups, amino acids, peptides and polypeptides.

Molecules can be used for applications in microelectronics which contain conjugated π-systems. Especially in the case of such compounds activation with peroxides known in the prior art is disadvantageous since the occurrence of undesired radical side reactions is observed. In contrast by irradiating according to the invention with light of a defined wavelength it is possible to selectively activate those reactive groups that are intended for binding to the metallic surface and at the same time not to influence other groups e.g. π-bonds or conjugated π-bonds in the molecule. Polyenes, aromatics, e.g. polyphenylenes, heterocycles e.g. polyheteroaryls and/or polyacetylenes are preferably used as organic molecules containing conjugated ρ-systems.

After application to the metallic or semimetallic surface the coating can be cross-linked by means of cross-linkable groups such as double bonds e.g. acrylic esters or/and triple bonds. Cross-linking can also be achieved by oxidation e.g. of sulphur-containing groups such as thiol or thiophene groups.

By using haptens, polypeptides and/or biotin it is possible to form solid phases that are capable of specific binding which can for example be used in diagnostic methods e.g. immunoassays.

When the surface is coated with nucleotides, nucleic acids or nucleic acid analogues such as peptidic nucleic acids, surfaces are obtained that are for example suitable for nucleic acid hybridization tests.

The use of polyethylene glycol or other inert molecules enables the production of chemically inert and resistant surfaces as well as biocompatible surfaces e.g. for use as implant surfaces.

Electrically conductive groups and certain polypeptides such as bacteriorhodopsin are especially suitable for electronic applications.

The additional functional groups can be optionally blocked by protective groups during the binding of the organic molecules to the surface. However, such blocking is often unnecessary if the wavelength used for the photoactivation is selected such that although the photoactivatable group is activated, the additional functional group does not react in the wavelength range of the irradiated light.

A metallic or semimetallic surface is preferably used which contains at least one element selected from B, Al, Ga, Si, Ge and As. A silicon hydride surface is particularly preferably used as the surface. Such a surface can for example be produced by etching oxidized Si-(111) with ammonium fluoride (G. J. Pietsch, Appl. Phys. A: Mater. Sci. Process. A 60 (1995) 367-363; G. J. Pietsch, "Structur und Chemie technologischer Silicium-oberflächen", VDI "Fortschrittsberichte" series 9, 148, VDI Publishers, Düsseldorf 1992).

The coating is preferably carried out in an inert gas atmosphere, for example under argon.

The light source used for irradiation in the process according to the invention must have sufficient intensity to achieve an adequate coating efficiency.

Basically any type of light source is suitable for the coating e.g. lamps such as a HBO lamp (high-pressure mercury lamp). However, the use of lasers has proven to be particularly advantageous. The light source is preferably able to radiate light of a defined wavelength or of a defined wavelength range. This can be achieved by using monochromatic light sources such as a laser or appropriate filters. When monochromatic light or light with a narrowly defined wavelength range is used, it is possible to selectively excite the photoactivatable groups of the coating molecules or/and of the surface while other functional groups present in the coating molecules are not influenced.

Light is preferably used with a wavelength in the range 350 to 400 nm, in particular 370 to 395 nm. It is particularly preferable to irradiate with light of a wavelength in the range 380 to 390 nm.

The irradiation period and intensity depends on the desired degree of coverage, the metallic or semimetallic surface that is used, the coating molecules that are used and the reaction conditions. Usually the desired results are obtained by irradiating for a period of 1 minute to 30 hours.

The process according to the invention produces a laterally homogeneous layer of coating molecules, preferably a monolayer, over the coating area. In this process it is possible to use a single species of coating molecules and also a mixture of several species of coating molecules. In a preferred embodiment of the process according to the invention, a mixture of different coating molecules is used in which one species of coating molecule contains a group e.g. biotin, hapten, polypeptide, nucleic acid etc., capable of binding specifically to a free reaction partner whereas the other species of coating molecule contains no such functional group and thus acts as a diluent molecule. The molar ratio of functional coating molecules to diluent molecules is preferably 1:100 to 100:1.

An important advantage of the process according to the invention is that it is possible to selectively and precisely coat certain areas of a surface. For example a metallic or semimetallic surface can be selectively coated in very small spatial areas down to the micrometer range by using suitable optics or by using laser technology. Thus for example coating molecules which contain electrically conductive groups can be applied to desired sites by irradiation to form a circuit that can be used in microelectronics. Of course it is also possible to coat a large area of the surface. In addition to the use of lasers and/or focussing optics, a structured coating can also be applied by using masks or/and optical gratings. It is possible in this manner to produce coated metallic surfaces with any predetermined patterns. The process according to the invention is especially suitable for producing array structures which can for example be used in diagnostics to manufacture biosensors.

The application of molecules which have groups capable of specific binding such as haptens, biotins, nucleobases, nucleic acids, nucleic acid analogues, polypeptides etc. enables the production of coated surfaces for diagnostics. Surfaces which are composed of a material that is usually rejected by the body can be made biocompatible by using biocompatible organic molecules.

A further subject matter of the invention is a coated object comprising a carrier with a metallic or semimetallic surface and covalent molecules which are covalently bound thereto which is characterized in that the surface has an arrangement of coated and uncoated areas. The coated areas are preferably miniaturized i.e. they have an area of 1 $\mu m^2$ to 10 $mm^2$, particularly preferably 10 $\mu m^2$ to 1 $mm^2$. In contrast to the processes known in the prior art for coating metallic surfaces by chemical activation in which only a coating of the whole area was possible, the process according to the invention enables a structured coated surface to be obtained. A surface with a defined coating pattern can be produced in which the coating is only applied to pre-determined areas of the surface. The surface preferably has an array structure. Suitable focussing optics and/or laser techniques enable precise locally delimited areas to be selectively coated. The surface preferably comprises coating molecules which contain at least one additional functional group or mixtures of functional coating molecules with inert diluent molecules. Depending on the application it is possible to use appropriate functional groups as described above.

The invention is further elucidated by the attached figures and the following examples.

FIG. 1 shows compounds 1 to 3 which were used to coat metal surfaces. The compounds 1a, 1b and 1c are alkenes, compound 2 is a vinyl ether and compounds 3a and 3b are each an aldehyde.

FIG. 3 shows the dependency of the degree of coverage of a tetradecanal layer on an Si surface on the irradiated wavelength.

FIG. 4 shows the dependency of the degree of coverage of an octadecene layer on an Si surface on the irradiated wavelength.

EXAMPLES

Example 1

Coating of a H-Terminated Silicon Surface with Alkenes and Vinyl Ethers

An Si-H surface was produced by etching oxidized Si(111) wafers with ammonium fluoride according to known methods (G. J. Pietsch, Appl. Phys. A: Mater. Sci. Process. A 60 (1995) 347–363; G. J. Pietsch, "Struktur und Chemie technologischer Siliciumoberflächen", "VDI-Fortschrittsberichte", series 9, 148, VDI Publishers, Düsseldorf 1992). The silicon wafers (Si(111)p-type) were obtained from Wacker-Chemitronic GmbH and Siltronix.

Figure 1:
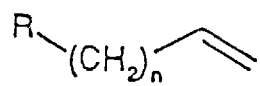
Figure 1:
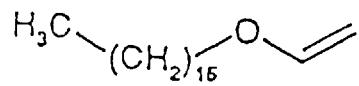
Figure 1:
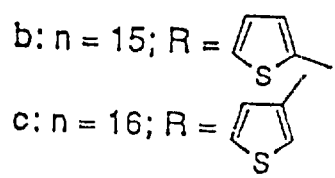
Figure 1:
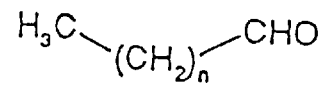

The H-terminated silicon surface etched with fluoride ions was added to the pure compounds 1, 2 or 3 (cf. FIG. 1) in a glass cuvette and irradiated for 20 to 24 h in an inert gas atmosphere. An optimal reaction time of 20 to 24 h was determined under the experimental conditions used here whereby shorter or longer reaction times result in a reduced coverage. The formation of self-assembling monolayers was initiated by irradiation with a HBO lamp (150 W). Then the silicon substrate was removed, rinsed several times with dichloromethane and wiped with cotton in order to remove physically adsorbed material.

As a comparison the formation of monolayers containing 1-octadecene (1a) on a H-terminated Si(111) surface was initiated by dioctadecanoyl peroxide according to the prior art (M. R. Linford et al., J. Am. Chem. Soc. 117 (1995), 3145–3155). The results are shown in Table 1.

TABLE 1

| Reactants | Reaction time (hours) | Temperature (° C.) | $v_{as}(CH_2)$ $(cm^{-1})$ | Coverage (%) [a] | Contact angle $\theta_a(H_2O)$ (degree) |
|---|---|---|---|---|---|
| $[C_{17}H_{35}C(O)O]_2$ | 1.5 | 100 | 2918.7 | 50.5 | 91 |
| $[C_{17}H_{35}C[O])O]_2$/ 1a (1:1) | 1.0 | 102 | 2918.6 | 57 | 96 |
| $[C_{17}H_{35}C(O)O]_2$/ 1a (1:9 | 1.5 | 101.0 | 2920.0 | 48 | 91 |

TABLE 1-continued

| Reactants | Reaction time (hours) | Temperature (° C.) | $v_{as}(CH_2)$ $(cm^{-1})$ | Coverage (%) [a] | Contact angle $\theta_a(H_2O)$ (degree) |
|---|---|---|---|---|---|
| OTS | 15 | 20 | 2917.7 | 100 | 106 |
| 1a | 24 | 20–50 [b] | 2920.5 | 55 | 95 |
| 1a[c] | 20 | 20–50 [b] | 2922.4 | 21 | — |
| 1b | 13 | 20–50 [b] | 2920.0 | 40 | — |
| 1c | 20 | 20–50 [b] | 2921.6 | 29 | — |
| 2 | 20 | 30 | 2921.0 | 45 | 80 |

[a] relative to octadecyltrichlorosilane (OTS) films with 100% coverage
[b] The temperature increased to 50° C. during irradiation.
[c] Dilution of compound 1a: hexadecane in a ratio of 9:1

As can be seen in Table 1 the process according to the invention enables approximately the same degrees of coverage to be obtained for alkenes as processes using peroxides known in the prior art but without having to use these hazardous and unspecific chemical reagents.

The surface coverage was calculated using equation 1:

$$y=0.007x-0.03429 (x=\text{number of } CH_2 \text{ groups})$$

which was obtained by linear regression analysis of the diagram areas of the $v_{as}(CH_2)$ and $v_s(CH_2)$ bands of seven alkyltrichlorosilanes (wafer data) in relation to their chain length (8, 10, 12, 14, 16, 18 and 20 $CH_2$ groups) (S. Heit et al., Langmuir 12 (1996) 2118–2120). The coverage is obtained by dividing the areas of the bands of $v_{as}(CH_2)$ and $v_s(CH_2)$ by y.

In addition to the terminally non-substituted 1-alkene 1a, the monolayer formation was also examined using the pure ω-thienyl-substituted 1-alkenes 1b and c and the hexadecylvinyl ether 2 by irradiation under comparable conditions. Moreover it was found that even a low dilution of the 1-alkenes with an alkane as a solvent considerably influences the formation of the self-assembling monolayer which results in a low coverage. The use of a mixture comprising nine parts of compound 1a and one part hexadecane for example has a degree of coverage of only 20%.

Example 2

Coating of a H-Terminated Silicon Surface with Aldehydes

Figure 2:
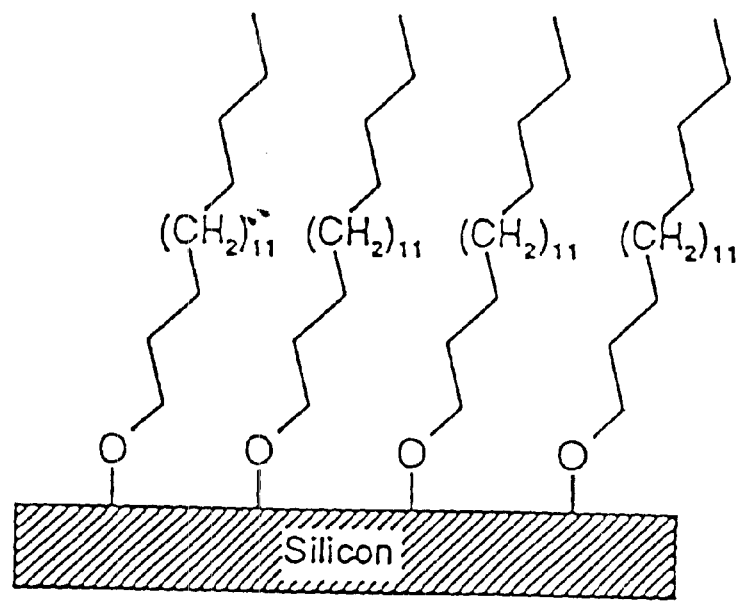
FIG. 2 shows schematically the formation of a layer of octadecanal 3a on a H-terminated Si-(111) surface.

The experiment described in example 1 was carried out under the same conditions as described for compound 1a except that pure 1-octadecanal (3a) (R. Redcliff et al., J. Org. Chem. 35 (1970), 4000–4002) was used as a coating molecule. It was established by high resolution AFM images (50×50 $nm^2$) that a homogeneous self-assembling monolayer is obtained with a high degree of coverage of 97% relative to 100% coverage with octadecyltrichloro-silane (OTS). A monolayer of compound 3a is shown schematically in FIG. 2. A mean angle of inclination of 12° for the molecules in the monolayer relative to the substrate can be derived from the dichroic ratio D=0.54 (A. Ulman, An Introduction to Ultrathin Organic Films, Academic Press, London 1991). This result corresponds to the literature data for OTS films (M. R. Linford et al., J. Am. Chem. Soc. 117 (1995) 3145–3155.

Example 3

Formation of a Self-Assembling Monolayer Using Different Wavelengths

Pure tetradecanal (compound 3b) was applied as described in example 1 on a Si(111) H surface at 40° C. at various radiation wavelengths. An XBO lamp (450 W) and a double monochromator (Jarrell Ash Co. mod. 82-440) with 1.3 nm half width was used as a light source. The results are summarized in Table 2 and FIG. 3.

TABLE 2

| Wavelength (nm) | Irradiation period (h) | $v_{as}(CH_2)$ (cm$^{-1}$) | Area $v_s$ and $v_{as}$ (CH$_2$) | Degree of coverage (%) [a] |
|---|---|---|---|---|
| 355 | 15.5 | 2922 | 0.0297 | 46 |
| 365 | 16.5 | 2925 | 0.03468 | 53 |
| 375 | 16.8 | 2922 | 0.03069 | 48 |
| 380 | 14.8 | 2921 | 0.03652 | 57 |
| 385 | 16.4 | 2920 | 0.0656 | 103 |
| 395 | 16.0 | 2922 | 0.03207 | 50 |
| 405 | 14.5 | — | — | 0 |
| 415 | 15.0 | — | — | 0 |

[a] Relative to OTS films with 100% coverage.

As seen from Table 2 and FIG. 3 the maximum degree of coverage was obtained with light of a wavelength of 385 nm.

The dependency of the degree of coverage on the wavelength was examined analogously using pure octadecene (compound 1a). Also in this case a maximum coverage at 385 nm was obtained (cf. FIG. 4).

Example 4

Formation of a Self-Assembling Monolayer of Aldehydes in Relation to the Irradiation Period The rate of formation of self-assembling monolayers was examined with pure octadecanal (compound 3a) on a Si (111) H surface. The influence of the irradiation period on the degree of coverage and orientation of the monolayers that are formed is summarized in Table 3.

TABLE 3

| Irradiation period (min) | $v_{as}(CH_2)$ (cm$^{-2}$) | area $v_s$ and $v_{as}$ (CH$_2$) | Degree of coverage (%) [a] |
|---|---|---|---|
| 1 | 2922 | 0.0357 | 39 |
| 3 | 2918 | 0.0746 | 82 |
| 5 | 2917 | 0.0943 | 103 |
| 30 | 2916 | 0.0975 | 106 |
| 60 | 2916 | 0.0978 | 107 |
| 120 | 2916 | 0.0833 | 91 |

[a] Relative to OTS films with a degree of coverage of 100%

The H-terminated Si surface prepared as described in example 1 was added to pure octadecanal (compound 3a) in a glass cuvette. It was heated to 70° C. and irradiated with polychromatic light for the periods stated in Table 3. The surface was removed and purified as described in example 1.

After one minute irradiation period a degree of coverage of 39% was found and the position of the $v_{as}(CH_2)$ band at 2922 cm$^{-1}$ shows a low order of the monolayer. The degree of coverage was increased to 80% after 3 minutes. Already with an irradiation period of 5 minutes it was possible to obtain an optimal degree of coverage of 103%. The $v^{as}$ (CH$_2$) band at 2917 cm$^{-1}$ indicates the formation of perfectly ordered self-assembling monolayer of compound 3a.

Example 5

Preparation of Laterally Structured Coated Surfaces

In previous investigations on the structure of self-assembly monolayers (Ulman, Chem. Rev. 96 (1996), 1533–1554 and further literature references; Xia and Whitesides, Angew. Chem. Int. Ed. Engl. 37 (1998), 550–575; Effenberger and Heid, Synthesis 1995, 1126–1130; Bierbaum et al., Langmuir 11 (1995), 512–518; Heid et al., Langmuir 12 (1996), 2118–2120; Harder et al., Langmuir 13 (1997), 445–454) it has not been possible to obtain a direct lateral structuring of the surfaces since one started with chemically uniform surfaces and the subsequent chemical reaction with the layer-forming substrates also proceeded uniformly.

However, the light-induced preparation of self-assembly monolayers enables a direct structuring of surfaces by using suitable masks. In this case foils that are used in the production of printed circuit boards are particularly suitable as masks.

The structures of the masks were drawn with the computer program Freehand 5.0 and directly printed with a laser-assisted photoset system (Lintotronic 530, Linotypelight, resolution 2540 dots/inch) on polymer foils (Fuji laser recorder film F100). Then the SiH substrate was covered with the mask, octadecanal was added and melted. The monolayer formation and purification was carried out as previously described.

On the basis of IR spectra it was possible to show that when a part of the Si(111) H surface is covered only the non-covered area results in a SAM layer. Moreover it was found that the non-exposed part of the SiH surface is still fully reactive.

Due to the different wettability of coated or uncoated silicon it is also possible to visualize the structuring of the silicon surface by observation with the naked eye or in a microscope. For this purpose the substrate provided with a structured coating was wetted under a microscope (Carl Zeiss, twenty-fold enlargement) with a few drops of a mixture of 2-propanol and universal oil (Lubricant Consult GmbH). The pattern that formed after a few seconds was photographed.

What is claimed is:

1. A process for coating a metallic or semimetallic surface, comprising:
   covalently binding to the metallic or semimetallic surface, by only irradiation with light, coating molecules containing groups that covalently bind to the surface by the irradiation with said light, to form a monolayer of monomeric molecules bound to the surface;
   wherein the covalent binding of the coating molecules to the surface is achieved via irradiation with said light which has a wavelength to cause a photoactivation of said groups by
   (a) a photoactivation of said groups in the coating molecules,
   (b) a photoactivation of groups on the surface, or
   (c) a combination of (a) and (b).

2. The process of claim 1 wherein the binding of the coated material is achieved by (c).

3. Process as claimed in claim 1, wherein said groups of the coating molecules are selected from C=C or C=O double bonds.

4. Process as claimed in claim 1, wherein said groups are selected from the group consisting of: reactive alkene, aldehyde, vinyl ether groups and mixtures thereof.

5. Process as claimed in claim 1, wherein the coating molecules contain at least one additional functional group in addition to the reactive groups.

6. Process as claimed in claim 5, wherein the additional functional group is at least one of haptens, biotin, chelating groups, nucleotides, nucleic acids, nucleic acid analogues, polyethylene glycol, conjugated π-systems, charged groups, non-linear optical groups, cross-linkable groups, electrically conductive groups, amino acids, peptides or polypeptides.

7. Process as claimed in claim 6 wherein the coating molecules contain conjugated π-systems as the additional functional groups.

8. Process as claimed in claim 7, wherein the coating molecules contain polyene, aryl, heteroaryl or/and polyacetylene groups.

9. Process as claimed in claim 7, wherein the additional functional groups are blocked from reacting with the surface by protective groups during binding to the surface.

10. Process as claimed in claim 1, wherein the surface comprises at least one element selected from B, Al, Ga, Si, Ge and As.

11. Process as claimed in claim 1, wherein the surface comprises at least one metal hydride or/and semimetal hydride compound.

12. Process as claimed in claim 11, wherein the surface contains a silicon hydride compound.

13. Process as claimed in claim 1, wherein the coating is carried out in inert gas atmosphere.

14. Process as claimed in claim 1, wherein the light has a wavelength in the range of 370–395 nm.

15. Process as claimed in claim 14, wherein the light is a monochromatic light.

16. Process as claimed in claim 1, wherein a mixture of different species of the coating molecules is used.

17. Process as claimed in claim 16, wherein one species of the coating molecules carries an additional functional group and another species of coating molecules carries no additional functional group.

18. Process as claimed in claim 1, wherein the coating applies a structured coating by using masks or/and optical gratings.

19. Process as claimed in claim 18, wherein array structures comprise said structured coating.

20. Process as claimed in claim 1, wherein binding molecules which have electrically conductive groups are applied for utilizing in microelectronics.

21. Process as claimed in one of claim 1, wherein binding molecules are applied which have groups capable of specific binding and are utilized for diagnostics.

22. Process as claimed in claim 1, wherein a biocompatible coating is produced.

* * * * *